(12) United States Patent
Demharter et al.

(10) Patent No.: US 7,904,762 B2
(45) Date of Patent: Mar. 8, 2011

(54) ERROR DETECTION ON MEDICAL HIGH SPEED TRANSMISSION ROUTES

(75) Inventors: Nikolaus Demharter, Dormitz (DE); Philipp Hoecht, Lauf (DE); Georg Pirkl, Dormitz (DE); Wilfried Schnell, Forchheim (DE)

(73) Assignee: Siemens Aktiengesellschaft, Munich (DE)

(*) Notice: Subject to any disclaimer, the term of this patent is extended or adjusted under 35 U.S.C. 154(b) by 271 days.

(21) Appl. No.: 11/962,604

(22) Filed: Dec. 21, 2007

(65) Prior Publication Data

US 2008/0155361 A1 Jun. 26, 2008

(30) Foreign Application Priority Data

Dec. 21, 2006 (DE) .................. 10 2006 060 777

(51) Int. Cl.
*G06F 11/08* (2006.01)
*G06F 11/36* (2006.01)

(52) U.S. Cl. .................. 714/704; 714/712

(58) Field of Classification Search .............. None
See application file for complete search history.

(56) References Cited

U.S. PATENT DOCUMENTS

| | | | | |
|---|---|---|---|---|
| 5,077,827 A | * | 12/1991 | Messerschmidt et al. | 455/1 |
| 5,559,842 A | * | 9/1996 | Javitt | 375/376 |
| 6,665,820 B1 | | 12/2003 | Frowein et al. | |
| 7,469,366 B1 | * | 12/2008 | Reed | 714/704 |
| 2004/0093239 A1 | * | 5/2004 | Ott et al. | 705/2 |
| 2004/0098654 A1 | | 5/2004 | Cheng et al. | |
| 2005/0262200 A1 | | 11/2005 | Moritzen | |
| 2006/0059392 A1 | * | 3/2006 | Kizer et al. | 714/704 |

FOREIGN PATENT DOCUMENTS

| | | | |
|---|---|---|---|
| DE | 102 56 466 A1 | | 6/2004 |
| JP | 02046033 A | * | 2/1990 |
| JP | 06268716 A | * | 9/1994 |

* cited by examiner

*Primary Examiner* — Robert Beausolel
*Assistant Examiner* — Dipakkumar Gandhi
(74) *Attorney, Agent, or Firm* — Schiff Hardin LLP

(57) ABSTRACT

In a transmission error logging device, method and computer-readable medium for logging transmission errors that occur on a high speed transmission route of a medical technology diagnostic apparatus, the in-feed port for a signal is provided on the high speed transmission route and an error signal is generated upon detection of an error. The transmission volume is detected by a transmission volume counter and the number of errors is detected by a transmission error counter. The transmission volume counter makes a transmission volume count, representing the transmission volume, available as an output from the transmission volume counter, and the transmission error counter makes a count of the number of errors detected by the error detection device available at an output of the transmission error counter.

10 Claims, 3 Drawing Sheets

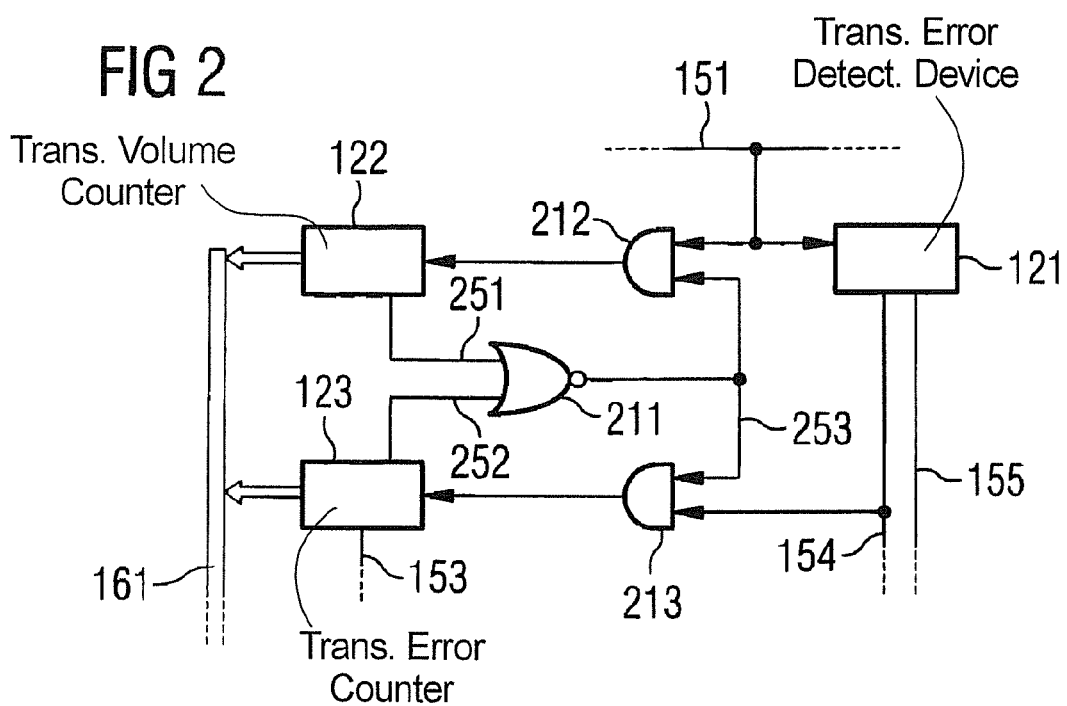
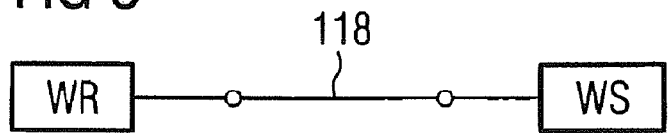
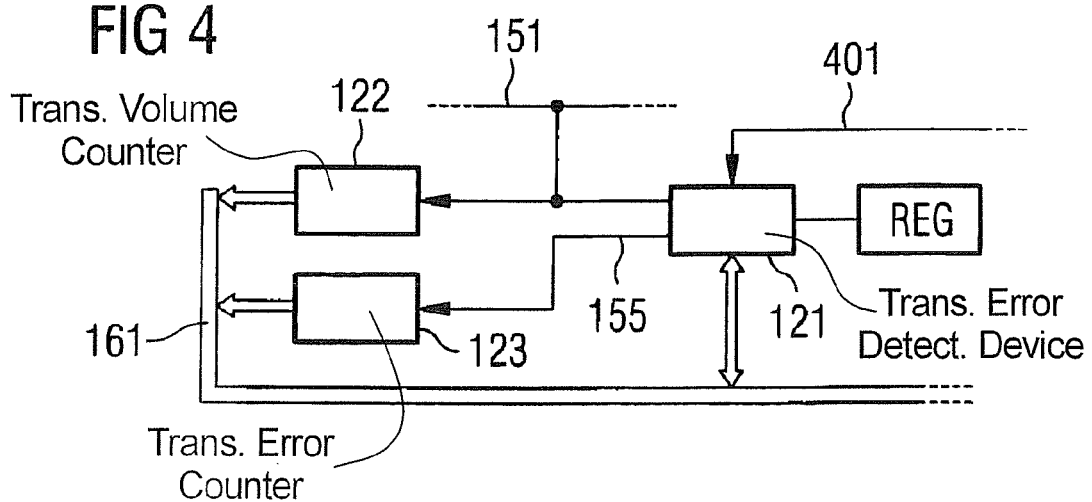

ERROR DETECTION ON MEDICAL HIGH SPEED TRANSMISSION ROUTES

BACKGROUND OF THE INVENTION

1. Field of the Invention

The invention concerns a device in a medical technology diagnostic apparatus for logging (protocolling) transmission errors that occur on a high speed transmission route.

2. Description of the Prior Art

If data on a high speed transmission route are secured against tampering with a forward error correction (FEC), single bit errors (for example) can be immediately corrected. In conventional forward error correction, two-bit errors can be detected but not corrected.

After the correction the data, which are now correct again, are available. Such high speed transmission routes are also used in medical technology, particularly in diagnostic apparatuses such as, for example, magnetic resonance tomography systems.

For a reliable statement of how high the transmission quality of the transmission route is at the moment, a procedure is required with which the error rate can be represented. Logging or numerical detection and recording of transmission errors that have occurred is required for this purpose.

SUMMARY OF THE INVENTION

An object of the present invention is to improve conventional error monitoring and consequently the transmission quality of the transmission route.

The above object is achieved in accordance with the invention by a transmission error logging device that logs transmission errors that occur on a high speed transmission route of a medical diagnostic apparatus, the transmission error logging device having an in-feed port for a signal that is present on the high speed transmission route, a transmission error detection device that generates an error signal upon detection of an error, a transmission volume counter, and a transmission error counter. The transmission volume counter makes a transmission volume count, representing the transmission volume, available as an output from the transmission volume counter, and the transmission error counter makes a count of the number of errors detected by the error detection device available at an output of the transmission error counter.

The transmission error logging device is associated with the reception side of a high speed transmission route. The transmission error detection device generates an error signal upon detection of a transmission error. For example, the transmission error can be a one-bit error or a two-bit error. The transmission error detection device can be specialized for the detection of one error type (for example one-bit error, two-bit error) or can respond to multiple error types. The error signal prompts the transmission error counter to increment its counter state. A number of transmission error counters respectively for various types of transmission errors (such as 1-bit errors or 2-bit errors) can be provided. The transmission volume counter similarly reacts to each data block received at the reception side by incrementing its counter state. The data block that causes an increment can be a single bit or a multiple of one bit (such as, for example, 1024 bits=1 kbit) as long as the precision thereby achieved is sufficient for the intended application. By evaluation of the counter states of the transmission volume counter and bit error counter or counters, a quantitative statement about the quality of a high speed transmission route that exhibits a transmission error detection device is possible. This measurement can be implemented continuously. A gradual worsening (degradation) (for example over a time span of months or years) can be discerned with a continuous measurement. The recorded counter states in particular concern the time span since the last start or the last reset of the counters. A gradually worsening connection can presage an imminent (early) failure of the transmission route. This state can be detected with the described transmission error logging device so monitoring, maintenance, repair or replacement of the transmission route can be instigated.

The transmission error logging device can furthermore have a memory device that is connected with the transmission error detection device and that is designed to store an error code generated by the transmission error detection device upon the occurrence of the error signal. The error signal generated by the transmission error detection device can serve as a write signal ("write strobe") for the memory. The error code initially serves for the immediate correction of a transmission error that has occurred, in the event that the transmission error can be corrected. The transmission error logging device extended by this feature also retroactively enables a precise localization of the transmission error within a data block via the stored error code. Furthermore, the transmission error logging device can detect systematic causes for occurred transmission errors and aid in their correction since a systematic cause is usually manifested by a systematic error. The detection of a systematic error can be based on the fact that a specific error code occurs more frequently than other error codes because, in the absence of a systematic error, a uniform statistical distribution of the error codes can be assumed. It can also be the case that a group of error codes shows a behavior that indicates a systematic error cause. For example, two specific error codes could conspicuously frequently follow one another, which can be established via an evaluation of the content of the memory device. The memory device can be a type of dual port RAM.

The memory device can also be connected with the transmission error counter and be designed to use a transmission error count that is output by the transmission error counter as a memory address upon storage of the error code. In this manner every error code is stored at a memory address that corresponds to the number of the associated error. An association between error and memory address or the error code stored there is thus possible via an error number.

The transmission volume counter can have a port for readout of the transmission volume by software and the transmission error counter can have a port for readout of the transmission error count by software. For this purpose the counters can be connectable with a data processing device via an interface. The data processing device can assign an address or an address range to the counters, which allows it to specifically access the data stored by the counters. The counter states can be read out at time intervals using a suitable software program, which enables a temporal analysis of the occurred transmission errors, for example with regard to accumulated transmission errors under specific conditions.

If applicable, the memory content of the memory device can be read out via software. The readout of the memory content via software provides the possibility of executing both simple and computationally-intensive analyses on the stored data. Extensive statistical analyses can in particular be implemented on the basis of the read-out memory content.

The transmission volume counter and the transmission error counter each can have an overflow monitor. Both the transmission volume counter and the transmission error counter are stopped when the overflow monitor detects an overflow of either the transmission volume counter or the transmission error counter. An overflow of at least one of the counters usually adulterates the error statistics. Either a transmission error frequency that is too low exists in the event that an overflow occurs in the transmission error counter, or a transmission error frequency that is too high exists in the event that an overflow occurs in the transmission volume counter. One possibility to counteract this situation is to arrest both counters as soon as one of them goes into saturation, i.e. has produced an overflow. In this case a resetting of the counter state to zero can ensue in the context of the next software-conducted readout of the counter states. The resetting and restarting of the counting can also be initiated by the counters themselves, but then the information about how often the counters have been reset may possibly be lost which in turn would lead to an adulteration of the statistical result. The dimensioning of the counters and the readout interval are normally matched to one another so that overflows are largely avoided. Another possibility is to use the overflow signals of the counters as an interrupt for a processor that thereupon initiates the readout of the counter states.

The invention also concerns a reception device that embodies the transmission logging device previously described. Such a reception device can be part of a transmission system which furthermore embodies a transmitter. The transmission error detection device of the reception device can cooperate with a device at the transmitter side which, for example, adds supplementary information to the transferred data that enables an establishment of transmission errors by the transmission logging device.

The present invention furthermore encompasses a transmission error logging method for logging transmission errors that occur on a high speed transmission route of a medical diagnostic apparatus.

In the following the invention is described based on the method. Advantages, features or alternative embodiments are likewise applicable to the aforementioned logging as well as to a computer device, readable medium encoded with programming instructions that cause a computer (processor) to implement the inventive method.

The method includes logging a volume of transferred data that are transferred via a high speed transmission route, detecting transmission errors in the transferred data, and recording of the number of transmission errors that are detected in the transferred data volume.

A quantitative statement about the quality of the high speed transmission route that uses the transmission error detection device is possible by measurement and evaluation of the detected transmission volume and the number of the transmission errors. This measurement can be implemented continuously. Detection of a gradual degradation (for example in the time span of months or years) is also possible with a continuous measurement. The detected transmission volume and the detected number of transmission errors in particular concern the time span since the last start or the last reset of the recorded information. A gradually worsening connection can be a predictor of an imminent failure of the transmission route. This state can be detected with the described transmission error logging method so monitoring, maintenance, repair and/or replacement of the transmission route can be initiated.

The transmission error logging method can also include a storage of an error code that is generated upon detection of transmission errors. This also retroactively enables a localization of the transmission error in a data block. Furthermore, the present transmission error logging method can detect systematic causes of occurred transmission errors and aid in their correction since a systematic cause is frequently manifested by a systematic error. The detection of a systematic error can be based on the fact that a specific error code occurs more frequently than other error codes. It may also occur that a group of error codes shows a behavior that indicates a systematic error cause. For example, two specific error codes can conspicuously frequently follow one another, which can be established by evaluation of the recorded information.

The storage of the error code can ensue at an address of a memory device that is determined by the number of transmission errors. In this manner each occurred error code is stored at a memory address that corresponds to the number of the associated error. An association between error and memory address or the error code stored there is thus possible via an error number.

The transmission error logging method can also include readout of the transmission volume and the number of transmission errors. The information recorded by the method thus can be provided for a further use or evaluation. The readout of this information can ensue at temporal intervals, which enables a temporal analysis of the occurred transmission errors, for example with regard to accumulated transmission errors under specific conditions.

The transmission error detection method can also include arresting both the detection of the transmission volume and the detection of the number of transmission errors when either the transmission volume or the number of transmission errors reaches a respective maximum. For example, this maximum can be predetermined by the maximum allowable numerical range of a counter that is used for the logging of the respective information. The simultaneous arresting of both the detection of the transmission volume and the detection of the number of transmission errors ensures that an adulteration of the recorded information does not occur. A resetting of the recorded information to zero can ensue in this case in the context of readout of the information conducted by software.

The invention also encompasses a computer program product which can be loaded directly into a memory of a computer, with program code (programming instructions) that cause all actions of the method as described to be implemented when the program is executed in the computer. The features described in connection with the method are also applicable to the computer program product.

The program code can cause the logging and detection be implemented directly by the computer. Alternatively, the transmission error logging program can control, configure, activate hardware that is designed for the purposes of the logging and detection. For example, the transmission error logging program can initiate the loading of a polynomial (as is required for what is known as a forward error correction (FEC)) into a register provided for the polynomial. For example, this register can be part of an ASIC (application-specific integrated circuit) or can be connected therewith. The ASIC can be designed for the forward error correction, in particular on high speed transmission routes. The transmission volume counter and the transmission error counter can be designed as variables that are used by the program code. In this case the storage of the value of the variables occurs in a general working memory of the computer.

BRIEF DESCRIPTION OF THE DRAWINGS

FIG. 2 is a detailed representation of an aspect of a transmission error logging device according to the present invention.

FIG. 3 illustrates an application example of the present invention.

FIG. 4 is a detailed representation of a further embodiment of a transmission error logging device according to the present invention.

DESCRIPTION OF THE PREFERRED EMBODIMENTS

Figure 1:
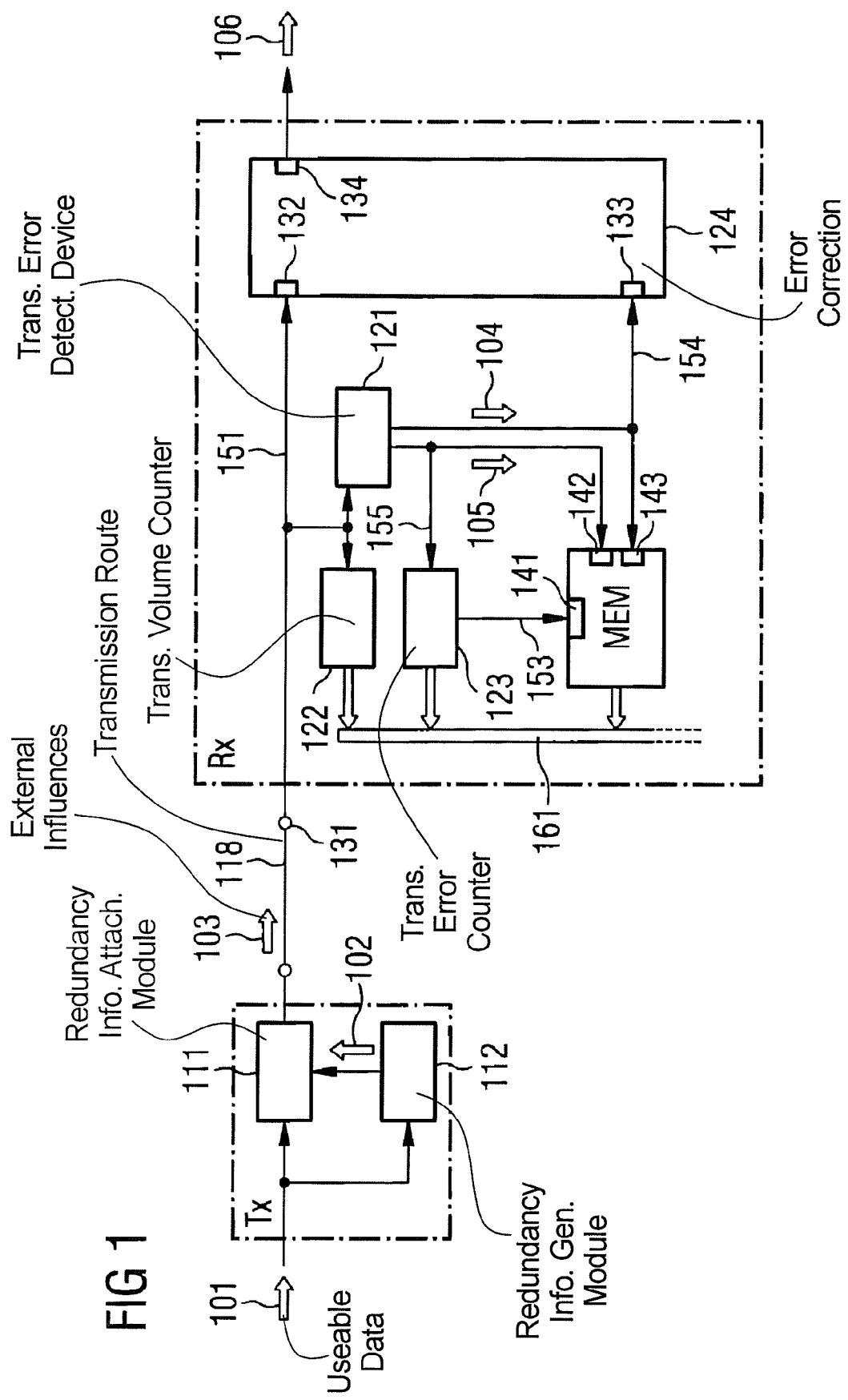
FIG. 1 is an overview representation of a transmission system used in a medical diagnostic apparatus.

FIG. 1 shows a transmission system as used, for example, in a medical technology diagnostic apparatus. Numerous medical technology diagnosis methods that are based on the interaction of the body of a patient with, for example, electromagnetic fields or rays produce large data sets in sensors in an instant or in the course of the acquisition, which sensors are suitable for the selected medical technology method. Such data must be transmitted from the sensors to a data processing unit in which the preparation of the raw data delivered by the sensors ensues. A transfer system that is capable of handling such data is required. The possibility does exist to buffer the accumulating data near the sensors or in the sensors, but large buffer memories in proximity to the sensors would be required when the medical technology diagnosis method enables a continuous data acquisition. Moreover, such a measure slows the entire diagnosis procedure.

A fast data transfer between sensor and downstream units is therefore typically used. The speed of the data transfer is based not only on the use of suitable physical transmission technology but also on the operation of the employed physical transmission technology at high performance. This can occur, for example, by operating with a high clock frequency, which leads to the situation of the detection of the value of a transferred bit being less reliable at the receiver side. This in turn leads to an increase of the error rate.

Here a forward error correction (FEC) provides a remedy. This is a technology that serves to decrease the error rate in the transmission of digital data. The sender encodes the data to be transmitted in a redundant manner so that the receiver can detect and correct errors.

The transmission system shown in FIG. 1 uses forward correction. The transmission system serves to transfer an input signal or usable data 101 from a transmitter side Tx to a receiver side Rx. Arranged at the transmitter side is an encoder that accepts the usable data 101. The encoder comprises a module 112 for generation of redundancy information 102 as well as a module 111 for attaching the redundancy information 102 to the usable data 101.

The usable data 101, extended by the redundancy information 102, form the data 103 to be transferred, which data 103 are sent by the transmitter to the receiver via the transmission route 118. During the transmission on the transmission route the data can be adulterated, for example, by external influences 103, such that a transmission error occurs.

A transmission error logging device that has an in-feed port 131 for the data 103 present on the transmission route 118 is provided on the receiver side. The data 103 are relayed to a transmission signal line 151 via the in-feed port 131. Within the transmission error logging device, the transferred data 103 are relayed to various modules, namely to a transmission error detection device 121, a transmission volume counter 122 and an error correction 124. The transmission volume counter 122 counts all data that arrive at the transmission error logging device via the transmission route 118. This counting can relate to transferred bits, bytes or multiples thereof. The transmission error detection device 121 evaluates the transferred data 103 with regard to transmission errors. This typically occurs by division of the data 103 by a polynomial. In the event that the remainder arising in the division is zero, this indicates that no transmission error occurred. In the event that the remainder is not equal to zero, at least one transmission error exists. The division remainder is also designated as a syndrome 104 and is output by the transmission error detection device 121 via the syndrome line 154. Usually the position of an individual transmission error can be determined from the value of the remainder, such that a receiver-side correction is possible. The syndrome is transmitted to the error correction 124. From this purpose, error correction 124 can generate error-corrected usable data 106 in connection with the transferred data 103 (which is supplied to the error correction via its input 132) and output the error-corrected usable data 106 at the output 134. The error-corrected usable data 106 can also be directly extracted from the result of the division implemented by the transmission error detection device 121.

The transmission error detection device 121 is also connected via an error signal line 155 with a transmission error counter 123 and a memory device MEM. The error line 155 is connected to a clock signal input port 142 of the memory MEM. An error signal 105 that assumes a specific value (for example logically 1) when the transmission error detection device 121 has detected an error is transmitted on the error signal line 155. This prompts the transmission error counter 123 to increment its counter state. The memory device MEM is prompted by the error signal 105 to accept the data present at its data inputs 143 into the memory, and in fact at the address that is determined by the data that are present at its address inputs 141. The data inputs 143 of the memory device MEM are connected to the syndrome line 154 so that the syndrome 104 is stored in the memory device MEM as soon as an error signal 105 is present. The address inputs 141 of the memory device MEM is connected to a transmission error count line 153 whose other end is connected to the transmission error counter 123. The current counter state of the transmission error counter 123 is thus used as address information for the storage procedure.

The transmission volume counter 122, the transmission volume counter 123 and the memory device MEM are connected with a bus 161 via which the respective contents can be read out as needed. The bus 161, among other things, can be connected with a processor, whereby the readout processes executed at the memory device MEM can be controlled by this processor.

A portion of a transmission error logging device that shows an optional feature is depicted in FIG. 2. So that an overflow of one of the counters does not adulterate the evaluation of the transmission error count, a further incrementing of the counters can be suspended until the counters are mutually reset. One of many possible circuits with which this goal can be achieved is shown in FIG. 2. The transmission volume counter 122 and the transmission error counter 123 respectively comprise an overflow output. The overflow output of the transmission volume counter 122 is connected with an overflow signal line 251 and the overflow output of the transmission error counter 123 is connected with an overflow signal line 252. The two overflow signal lines 251 and 252 lead to the inputs of a NOR gate 211. The output of the NOR gate 211 is connected with a line for a negated combined overflow signal 253. The negated combined overflow signal can also be understood as an activation signal. The line 253 is divided into two legs, of which the first leg is connected with an input of an AND gate 212 at the input of the transmission volume counter 122, the other with an input of an AND gate 213 at the input of the transmission error counter 123. In this manner the respective count pulses only arrive at the corresponding inputs of transmission volume counter 122 or transmission error counter 123 when the activation signal present at the AND gates 212, 213 had the logical value of 1. If the activation signal has the logical value of 0, this then means that at least one of the two counters 122 and 123 is located in an overflow situation in which a continuation of the operation of the counters would lead to false results.

FIG. 3 presents an application example of the present invention. A magnetic resonance tomograph MR is located at the sender side. This is connected with a workstation WS via the high speed transmission route 118. Magnetic resonance tomography produces large data sets that must be transferred from the tomograph MR to the workstation WS. The transmission error logging device is arranged at or in the workstation.

FIG. 4 shows a further optional feature of the transmission error logging device according to the present invention. The transmission error detection device 121 here likewise possesses a connection to the bus 161. This connection is designed to be bidirectional and enables operating parameters for the transmission error detection to be communicated to the transmission error detection device 121. The operating parameters can be stored in a register (or a group of registers) REG in order to be able to ensure continuous and fast access thereto for the transmission error detection device. The operating parameters can have, for example, as content the type of the forward error correction inclusive of a decoding polynomial to be employed.

Figure 5:
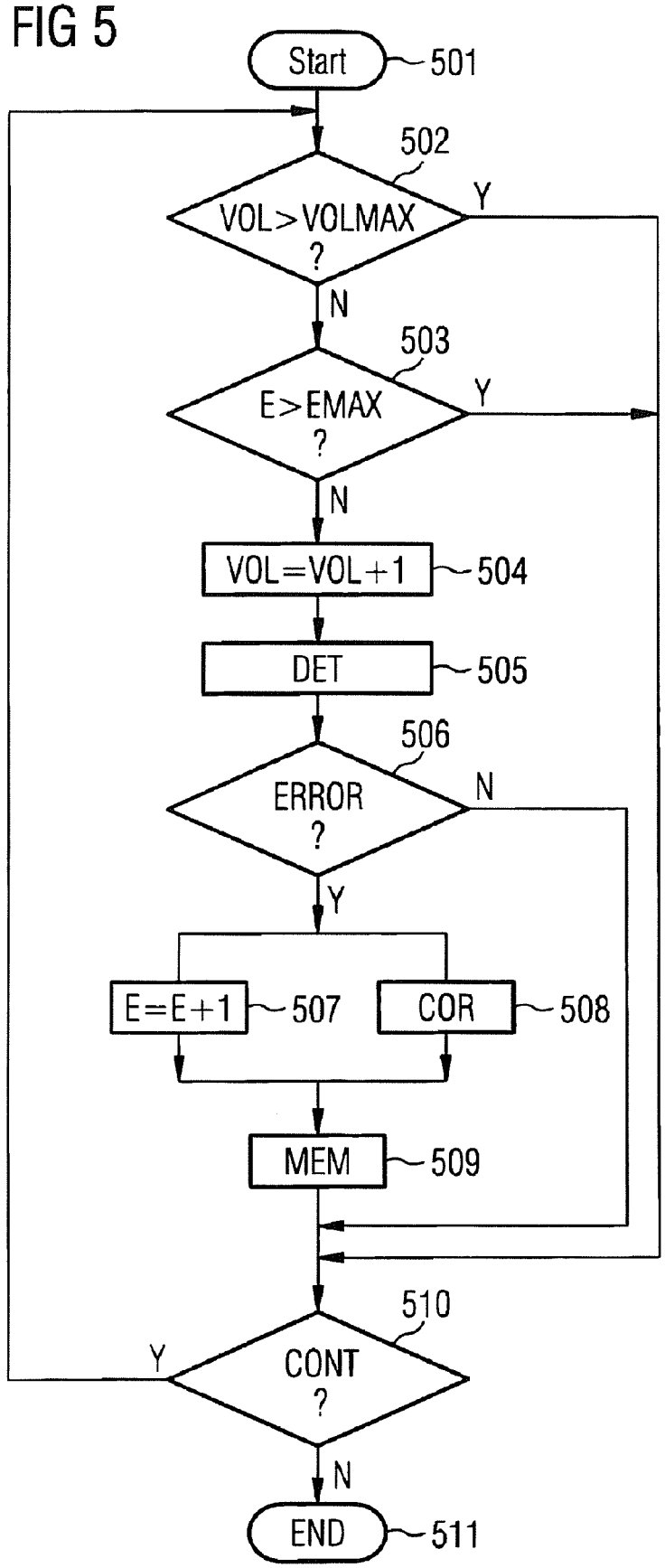
FIG. 5 is a flowchart of an embodiment of the method according to the invention.

A flowchart for an embodiment of the method according to the invention is shown in FIG. 5. The method begins at 501. A query is made in 502 as to whether the value presently stored by the transmission volume counter 122 for the transmission volume VOL is greater than a predetermined maximum value VOLMAX. The maximum value VOLMAX could be the numerical range of the transmission volume counter 122, but could also lie below this. In the event that the response to this query is positive, the method is continued in 510. In the event that the response to this query in 502 is negative, in 503 a further query is implemented with which it should be established whether the present value stored by the transmission error counter 123 for the transmission error count E is greater than a predetermined maximum value EMAX. The maximum value EMAX could be the numerical range of the transmission error counter 123, but could lie below this. In the event that the response to this query is positive, the method is continued in 510. In the event that the response to this query in 503 is negative, in 504 the value VOL indicating the transmission volume is incremented. Furthermore, in 505 an error detection is implemented with the aid of the transmission error detection device 121. The error detection as a result outputs whether it has detected an error in the last received data. In 506 the result of the error detection is examined for the presence of an error. If no error exists, the method continues in 510. However, if an error is detected, the three processes run in 507, 508 and 509. In 507 the counter state for the detected transmission errors is incremented. In 508 the error correction is implemented so that optimally completely error-corrected data can be delivered as output data 106. In 509 the syndrome determined during the error detection 505 is stored in the memory device MEM. In 510 a query is implemented as to whether the method is continued (CONT). If yes, the method returns to 502. If no, the method ends in 511.

Although modifications and changes may be suggested by those skilled in the art, it is the intention of the inventors to embody within the patent warranted hereon all changes and modifications as reasonably and properly come within the scope of their contribution to the art.

The invention claimed is:

1. A transmission error logging device that logs transmission errors occurring on a high-speed transmission route of a medical technology diagnostic apparatus, said transmission error logging device comprising:
  an infeed port configured to communicate with a medical sensor to receive an unpatterned sensor data signal, having no known pattern of data therein, from said medical sensor via the high-speed transmission route of the medical technology diagnostic apparatus that includes the medical sensor;
  a transmission error detector that processes said sensor data signal to generate an error signal upon detection of an each error in said sensor data signal;
  a memory connected to the transmission error detector that stores each error code upon detection of each error by said transmission error detector;
  a transmission volume counter that counts a transmission volume in said data signal supplied to said infeed port, said transmission volume being represented by a transmission volume count;
  a transmission error counter that counts a number of errors detected by said transmission error detector, said number being represented as a transmission error count;
  said transmission volume counter making said transmission volume count accessible as an output from said transmission volume counter; and
  a processor having access to said memory, said processor being configured to perform a statistical analysis of the errors stored in said memory.

2. A transmission error logging device as claimed in claim 1 wherein said memory device is also connected to said transmission error counter, and uses the transmission error count associated with the error that generated the error code as an address for the error code.

3. A transmission error logging device as claimed in claim 1 wherein said transmission volume counter comprises a port for software-executed readout of said transmission volume count, and wherein said transmission error counter comprises a port for software-executed readout of the transmission error count.

4. A transmission error logging device as claimed in claim 1 wherein said transmission volume counter comprises a first overflow monitor and wherein said transmission error counter comprises a second overflow monitor, and wherein said transmission error device comprises a control arrangement that arrests both of said transmission volume counter and said transmission error counter if either said first overflow monitor detects an overflow in said transmission volume counter or said second overflow monitor detects an overflow in said transmission error counter.

5. A medical technology diagnostic apparatus, comprising:
  a medical sensor configured to interact with a patient to detect medically-relevant information from the patient, and to emit an unpatterned sensor data signal comprising unpatterned sensor data representing said information, said sensor data having no known pattern in said sensor data signal;
  an infeed port that receives said sensor data signal via a high-speed transmission route existing between said infeed port and said medical sensor;
  a transmission error logging device comprising a transmission error detector that processes said sensor data signal to generate an error signal upon detection of each error in said sensor data signal, a memory connected to the transmission error detector that stores each error code upon detection of each error by said transmission error detector, a transmission volume counter that counts a transmission volume in said data signal supplied to said infeed port, said transmission volume being represented by a transmission volume count, a transmission error counter that counts a number of errors detected by said transmission error detector, represented as a transmission error count, and said transmission volume counter making said transmission volume count accessible as an output from said transmission volume counter; and a processor having access to said memory, said processor being configured to perform a statistical analysis of the errors stored in said memory.

6. A transmission error logging method for logging transmission errors occurring on a high-speed transmission route of a medical technology diagnostic apparatus, said method comprising the steps of:

supplying an unpatterned sensor data signal having no known data pattern therein, from a medical sensor to a processor via the high-speed transmission route of the medical technology diagnostic apparatus that includes the medical sensor;

processing said unpatterned sensor data signal in said processor to automatically generate an error signal upon detection of an error in said unpatterned sensor data signal;

in said processor, automatically counting a transmission volume supplied to said processor, and representing said transmission volume as a transmission volume count;

in said processor, automatically counting a number of detected errors, and representing said number as a transmission error count;

making said transmission volume count accessible as an output from said processor;

storing each error code in a memory upon detection of each error; and accessing said memory from a computer and, in said computer, performing a statistical analysis of the errors represented by the error codes in said memory.

7. A method as claimed in claim 6 comprising using the transmission error count associated with the error that generated the error code as an address for the error code in said memory.

8. A method as claimed in claim 6 comprising counting said transmission volume in a transmission volume counter and counting said number of errors in a transmission error counter, and executing a software readout of said transmission volume count from said transmission volume counter and a software readout of the transmission error count from said transmission error counter.

9. A method as claimed in claim 8 comprising monitoring overflow in said transmission volume counter and monitoring overflow in said transmission error counter, and arresting both of said transmission volume counter and said transmission error counter if either overflow is detected in said transmission volume counter or an overflow is detected in said transmission error counter.

10. A non-transitory computer-readable storage medium encoded with programming instructions that, when said medium is loaded in a computer that receives a data signal on a high-speed transmission route of a medical technology diagnostic apparatus, cause said computer to:

communicate with a medical sensor to receive an unpatterned sensor data signal therefrom, having no known pattern of data therein;

process said unpatterned sensor data signal to generate an error signal upon detection of an error in said sensor signal;

count a transmission volume supplied to said computer, and represent said transmission volume as a transmission volume count;

count a number of detected errors, and represent said number as a transmission error count;

make said transmission volume count accessible as an output from said computer;

store each error code in a memory upon detection of each error; and access said memory to perform a statistical analysis of the errors represented by the error codes stored in said memory.

* * * * *